United States Patent [19]

Crivello et al.

[11] 4,442,197

[45] Apr. 10, 1984

[54] PHOTOCURABLE COMPOSITIONS

[75] Inventors: James V. Crivello, Clifton Park; Julia L. Lee, Schenectady, both of N.Y.

[73] Assignee: General Electric Company, Schenectady, N.Y.

[21] Appl. No.: 338,818

[22] Filed: Jan. 11, 1982

[51] Int. Cl.$^3$ ............................................... G03C 1/68
[52] U.S. Cl. ............................. 430/280; 204/159.18; 204/159.23; 204/159.24; 430/270; 430/288; 430/921; 430/922; 430/914; 430/915
[58] Field of Search ............... 430/280, 281, 288, 914, 430/915, 921, 923, 922; 204/159.18, 159.23, 159.24

[56] References Cited

U.S. PATENT DOCUMENTS

| | | | |
|---|---|---|---|
| 4,026,705 | 5/1977 | Crivello et al. | 204/159.18 |
| 4,058,401 | 11/1977 | Crivello | 204/159.18 |
| 4,069,054 | 1/1978 | Smith | 430/919 |
| 4,090,936 | 5/1978 | Barton | 204/159.18 |
| 4,230,814 | 10/1980 | Crivello | 204/159.18 |
| 4,256,828 | 3/1981 | Smith | 430/280 |
| 4,291,114 | 9/1981 | Berggren et al. | 430/280 |
| 4,336,363 | 6/1982 | Crivello | 430/280 |

FOREIGN PATENT DOCUMENTS

| | | | |
|---|---|---|---|
| 845746 | 9/1976 | Belgium . | |
| 11918 | 6/1980 | European Pat. Off. | 430/914 |
| 1526923 | 10/1978 | United Kingdom | 430/921 |

OTHER PUBLICATIONS

Dye-Sensitized Photoinitiated Cationic Polymerization. The System: Perylene–Triarylsulfonium Salts, Crivello et al, Preprint 8593, Journal of Polymer Science, Polymer Chemistry Edition, vol. 17, 1059–1065 (1979).

*Primary Examiner*—Mary F. Downey
*Attorney, Agent, or Firm*—William A. Teoli; James C. Davis, Jr.; James Magee, Jr.

[57] ABSTRACT

Photocurable compositions are provided which can be cured with ultraviolet light at a wave length greater than 300 nm. The photocurable compositions are based on the use of cationically polymerizable organic materials, for example, an epoxy resin and a photoinitiator in the form of a dialkylphenacyl sulfonium salt or hydroxyaryldialkyl sulfonium salt which have been sensitized with a particular dye sensitizer.

7 Claims, No Drawings

PHOTOCURABLE COMPOSITIONS

BACKGROUND OF THE INVENTION

As taught by the prior art, it is often desirable in the field of graphic arts to effect the cure of UV curable organic materials at wave lengths greater than 300 nm because significant absorption can occur at wave lengths below 200 nm as the result of the use of a photographic film negative or fillers used in the organic coating. As shown in U.S. Pat. Nos. 4,069,054, 4,026,705 and 4,250,053, various classes of sensitizing dyes can be used to alter the spectral response of aromatic sulfonium and aromatic iodonium salts. Those skilled in the art also have found that even if a particular dye is found to be effective as a sensitizer for a certain photoinitiator, for example, a triarylsulfonium salt, it may be entirely useless as a sensitizer with a different arylsulfonium salt because of the unpredictable nature of the spectral response for a particular arylsulfonium salt-dye combination.

The present invention is based on the discovery that particular sensitizing compounds, for example, aromatic hydrocarbons such as perylene, pyrene, anthracene, etc., can be used to sensitize arylacyldialkyl sulfonium salts of the formula,

while aromatic ketones such as thioxanthone, chlorothioxanthone and benzophenone have been found to be effective as sensitizers for hydroxyaryldialkyl sulfonium salts of the formula,

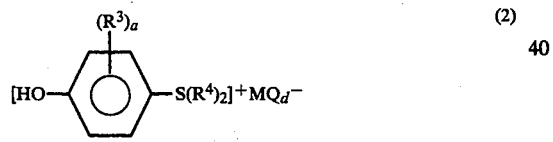

where R is a $C_{(6-13)}$ monovalent aromatic organic radicals or substituted $C_{(6-13)}$ monovalent aromatic organic radicals, $R^1$ is a monovalent radical selected from hydrogen, $C_{(1-8)}$ alkyl and mixtures thereof, $R^2$ is a $C_{(1-13)}$ monovalent organic radical, $R^3$ is a monovalent radical selected from $C_{(1-8)}$ alkyl, hydroxy, $C_{(1-8)}$ alkoxy, halo and nitro, $R^4$ is a $C_{(1-8)}$ alkyl radical, M is a metal or metalloid, Q is halogen and d is equal to 4–6.

STATEMENT OF THE INVENTION

There is provided by the present invention compositions which are photocurable at wave lenghts greater than 300 nm comprising a cationically polymerizable organic material and an effective amount of a photoinitiator selected from (A) a dialkylphenacyl sulfonium salt of formula (1) sensitized with an effective amount of a polynuclear aromatic hydrocarbon and/or phenothiazine and (B) a hydroxyaryldialkyl sulfonium salt of formula (2) sensitized with an effective amount of an aromatic ketone There are included by the dialkylphenacyl compounds of formula (1) sulfonium salts such as

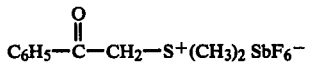

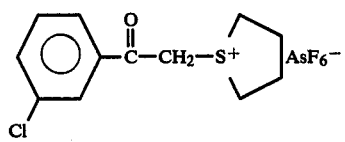

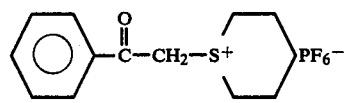

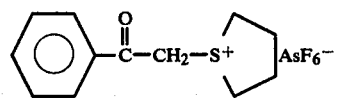

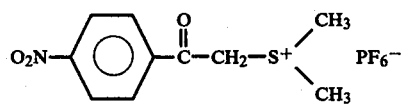

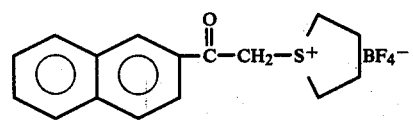

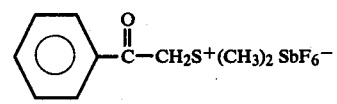

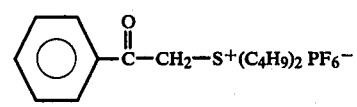

There are included by the hydroxyaryl dialkyl sulfonium salts of formula (2) compounds such as

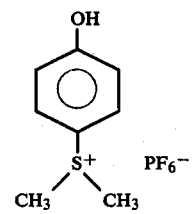

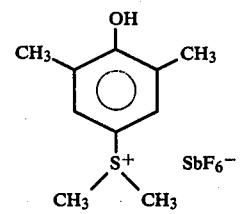

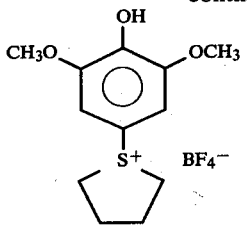
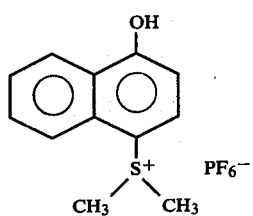
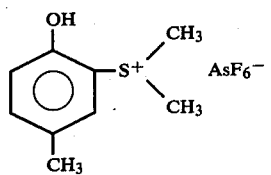
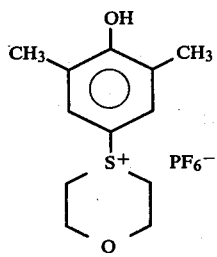
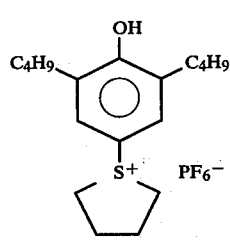
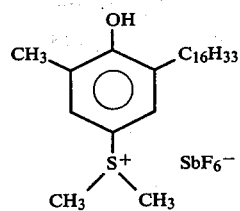
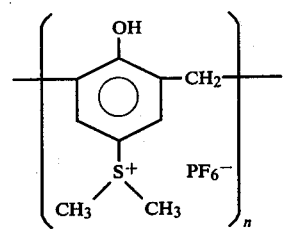

Some of the aromatic hydrocarbon photosensitizers which can be used with the dialkylarylacylsulfonium salts of formula (1) are, for example, anthracene, 1,2-benzanthracene, coronene, perylene, phenothiazine, pyrene, tetracene, ruberene, etc.

Among the aromatic ketones which can be used as photosensitizers with the hydroxyaryldialkylsulfonium salts of formula (2) are 9,10-anthraquinone, benzophenone, 2-chlorothioxanthone, 9-fluorenone, thioxanthone, Michlers ketone, xanthone, 4-hydroxy benzophenone, 4-nitrobenzophenone, acetophenone, etc.

The cationically polymerizable organic materials which can be used in the practice of the present invention include epoxy resins, for example, any monomeric, dimeric, or oligomeric or polymeric epoxy material containing one or a plurality of epoxy functional groups. For example those resins which result from the reaction of bisphenol-A (4,4'-isopropylidenediphenol) and epichlorohydrin, or by the reaction of low molecular weight phenolformaldehyde resin (Novolak resin) with epichlorohydrin can be used alone or in combination with an epoxy containing compound a reactive diluent. Such diluents as phenyl glycidyl ether, 4-vinylcyclohexane dioxide, limonene dioxide, 1,2-cyclohexene oxide, glycidyl acrylate, glycidyl methacrylate, styrene oxide, allyl glycidyl ether, etc., may be added as viscosity modifying agents.

In addition, the range of these compounds can be extended to include polymeric materials containing terminal or pendant epoxy groups. Examples of these compounds are vinyl copolymers containing glycidyl acrylate or methacrylate as one of the comonomers. Other classes of epoxy containing polymers amenable to cure using the above catalysts are epoxysiloxane resins, epoxy-polyurethanes and epoxy-polyesters. Such polymers usually have epoxy functional groups at the ends of their chains. Epoxy-siloxane resins and method for making are more particularly shown by E. P. Plueddemann and G. Fanger, J. Am. Chem. Soc. 80 632-5 (1959). As described in the literature, epoxy resins can also be modified in a number of standard ways such as reaction with amines, carboxylic acids, thiols, phenols, alcohols, etc., as shown in U.S. Pat. Nos. 2,935,488; 3,235,620; 3,369,055; 3,379,653; 3,398,211; 3,403,199; 3,563,840; 3,567,797; 3,677,995; etc. Further coreactants which can be used with epoxy resins are hydroxy terminated flexibilizers such as hydroxy terminated polyesters, shown in the Encyclopedia of Polymer Science and Technology, Vol. 6, 1967, Interscience Publishers, New York, pp. 209-271 and particularly p. 238.

Included by the thermosetting organic condensation resins of formaldehyde which can be used in the practice of the present invention are, for example, urea type resins, phenol-formaldehyde type resin.

In addition, there can be used melamine thiourea resins, melamine, or urea aldehyde resins, resol-formaldehyde resins and combinations with other carboxy, hydroxyl, amino and mercapto containing resins, such as polyesters, alkyds and polysulfides.

Some of the vinyl organic prepolymers which can be used to make the polymerizable compositions of the present invention are, for example, $CH_2=CH-O-(CH_2-CH_2O)_n-CH=CH_2$, where n is a positive integer having a value up to about 1000 or higher; multifunctional vinylethers, such as 1,2,3-propane trivinylether, trimethylolpropane trivinylether, prepolymers having the formula,

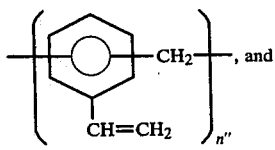

low molecular weight polybutadiene having a viscosity of from 200 to 10,000 centipoises at 25° C., etc. Products resulting from the cure of such compositions can be used as printing inks and other applications typical of thermosetting resins.

A further category of the organic materials which can be used to make the polymerizable compositions are cyclic ethers which are convertible to thermoplastics. Included by such cyclic ethers are, for example, oxetanes such as 3,3-bis-chloromethyloxetane, alkoxyoxetanes as shown by Schroeter, U.S. Pat. No. 3,673,216, assigned to the same assignee as the present invention; oxolanes such as tetrahydrofuran, oxepanes, oxygen containing spiro compounds, trioxane, dioxolane etc.

In addition to cyclic ethers there are also included cyclic esters such as β-lactones, for example propiolactone, cyclic amines, such as 1,3,3-trimethylazetidine and organosilicon cyclics, for example, materaials included by the formula,

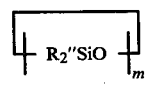

where R″ can be the same or different monovalent organic radical such as methyl or phenyl and m is an integer equal to 3 to 8 inclusive. An example of an organosilicon cyclic is hexamethyl trisiloxane, octamethyl tetrasiloxane, etc. The products made in accordance with the present invention are high molecular weight oils and gums.

There are also included among the cationically polymerizable organic materials polyvinyl compounds having the formula, $$R^6[GR^7OC(R^8)=C(R^9)_2]_{n'} \qquad (1)$$

where $R^6$ is a polyvalent aromatic organic radical, $R^7$ is a $C_{(1-8)}$ alkylene radical, $R^8$ and $R^9$ are the same or different monovalent radicals selected from hydrogen, halogen and $C_{(1-8)}$ alkyl radicals, G is selected from —O— and

and n′ is an integer equal to 2-10 inclusive.

Some of the aromatic polyvinylethers included by the above formula are,

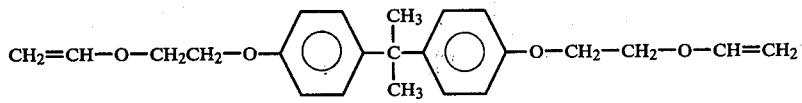

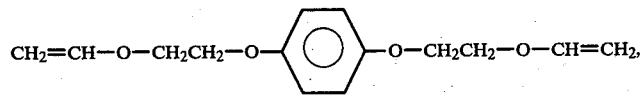

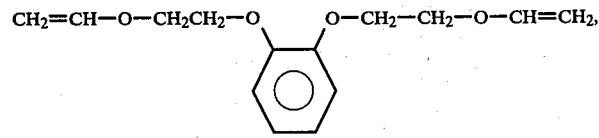

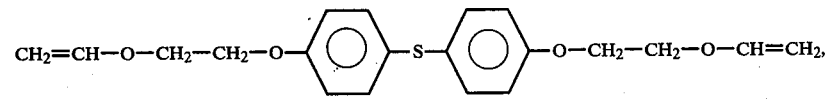

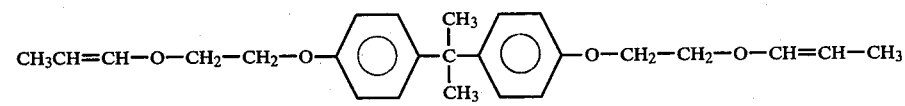

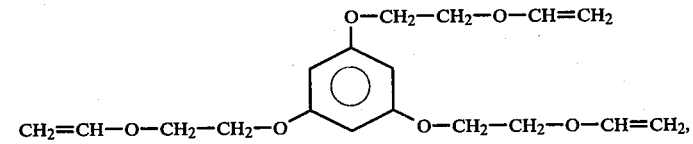

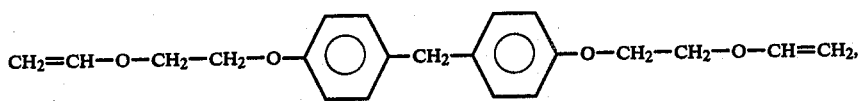

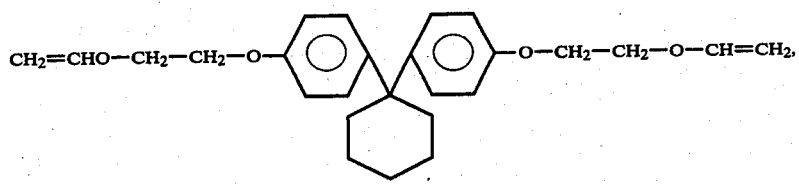

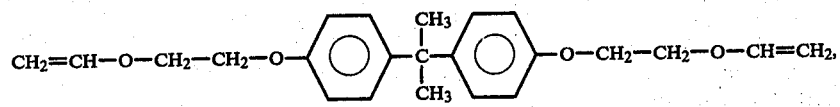

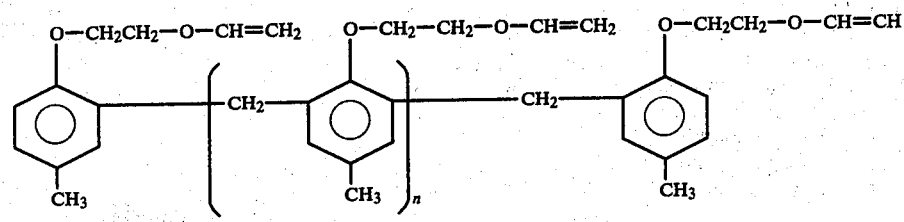

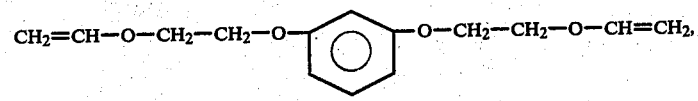

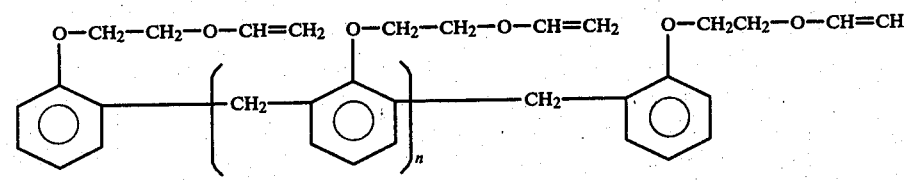

Experience has shown that a proportion of the aryl sulfonium salt which hereinafter can mean the arylacylsulfonium salt of formula (1) or the hydroxyarylsulfonium salt of formula (2), can be utilized with the cationic polymerizable organic material over a wide proportion by weight. Effective results can be achieved if a proportion of from 0.1 to 10% by weight of sulfonium salt based on the weight of the cationically polymerizable organic material is employed. It also has been found that a sensitizer, which hereinafter can mean either the polynuclear aromatic hydrocarbon or aromatic ketone can be used in a proportion of from 0.01% to 200% by weight, based on the weight of the arylonium salt.

The curable compositions may contain inactive ingredients such as inorganic fillers, extenders, pigments, viscosity control agents, process aids, UV screens etc., in amounts of from 0 to 100 parts of filler per 100 parts of the cationic polymerizable organic material. The curable compositions can be applied to such substrates as metal, rubber, plastic, molded parts or films, paper, wood, glass cloth, concrete, ceramic, etc.

The curable composition, which hereinafter means the cationically polymerizable organic material, containing an effective amount of the sulfonium salt and the sensitizer can be cured by exposing the curable composition to radiant energy such as electron beam or ultraviolet light. Electron beam cure can be effected at an accelerator voltage of from about 100 to 1,000 KV. Cure of the compositions is preferably achieved by the use of UV irradiation having a wavelength of from 1849 A to 4000 A and an intensity of at least 5,000–80,000 microwatts per cm$^2$. The lamp systems used to generate such radiation can consist of ultraviolet lamps such as from 1 to 50 discharge lamps, for example, xenon, metallic halide, metallic arc, such as a low, medium or high pressure mercury vapor discharge lamp, etc., having an operating pressure of from a few millimeters to about 10 atmospheres, etc., can be employed. The lamps can include envelopes capable of transmitting light of a wavelength of from about 1849 A to 4000 A, and preferably 2400 A to 4000 A. The lamp envelope can consist of quartz, such as Spectrocil, or Pyrex, etc. Typical lamps which can be employed for providing ultraviolet radiation are, for example, medium pressure mercury arcs, such as the GE H3T7 arc and the Hanovia 450 W arc lamp. The cures may be carried out with a combination of various lamps, some or all of which can operate in an inert atmosphere. When using UV lamps, the irradiation flux on the substrate can be at least 0.01 watts per square inch to effect cure of the organic resin within 1 to 20 seconds and permit the cure to be carried on continuously as, for example, in the curing of epoxy-coated steel strip to be taken up at a rate of from 100 to 1000 feet per minute. The strip can be cut to a predetermined width for use as transformer laminates, etc. A combination of heat and light may be used to cure reactive compositions. Such as combination of heat and light may serve to reduce the overall cure time.

In order that those skilled in the art will be better able to practice the invention, the following examples are given by way of illustration and not by way of limitation. All parts are by weight.

EXAMPLE 1

Various photosensitizers were screened with a 3% solution of phenacyltetramethylene sulfonium hexafluorophosphate and dimethyl(3,5-dimethyl-4-hydroxyphenyl)sulfonium hexafluoroarsenate in 3,4-epoxycyclohexyl-3',4'-epoxycyclohexanecarboxylate. The screening method involved the employment of 1% by weight of the photosensitizer based on the weight of the aforementioned epoxy sulfonium salt mixture mixture using a differential scanning colorimeter (DSC). The instrument was equipped with a GE H3T7 medium pressure mercury arc lamp and a filter with a cut-off absorption at 300 nm. Photosensitization was observed as an exothermic peak due to polymerization of the epoxy monomer in the presence of a photosensitizer as opposed to no peak when the photosensitizer was absent. The effectiveness of the photosensitizer was judged qualitatively from fair to excellent based on the sharpness of the exothermic peak in the DSC scan. The following results were obtained with the phenacyltetramethylene sulfonium hexafluorophosphate:

TABLE I

| Photosensitizer | Rating |
| --- | --- |
| Anthracene | fair |
| Perylene | excellent |
| Chrysene | good |
| Thioxanthone | very good |
| 4-Hydroxybenzophenone | good |
| Bianthrone | good |
| Xanthene | fair |
| Phenothiazine | very good |
| Phenanthraquinone | fair |
| Pyrene | good |
| Phenanthrene | fair |
| Ovalene | fair |
| 2-Chlorothioxanthone | good |
| Benzathracene | very good |
| Tetralone | fair |
| Coronene | very good |
| Anthrone | fair |
| Ninhydrin | fair |
| Naphthalene | fair |

The following results were obtained with dimethyl(3,5-dimethyl-4-hydroxyphenyl)sulfonium hexafluoroarsenate:

TABLE II

| Photosensitizer | Rating |
| --- | --- |
| Thioxanthone | very good |
| 9-Fluorenone | good |
| 2,4,7-Trinitrofluorenone | good |
| Xanthone | fair |
| Phenothiazine | fair |
| Chlorothioxanthone | fair |
| Benzanthracene-7,12-dione | good |
| Indanone | fair |

The above screening test revealed that polynuclear aromatic hydrocarbons sensitized phenacyltetramethylenesulfonium hexafluorophosphate more effectively than aromatic ketones. In addition, the above data also shows that aromatic ketones are effective sensitizers for dimethyl(3,5-dimethyl-4-hydroxyphenyl)sulfonium hexafluoroarsenate.

EXAMPLE 2

In order to further confirm the results of Example 1 in a more quantitative manner, phenacyltetramethylenesulfonium hexafluoroarsenate was used as a photoinitiator for 3,4-epoxycyclohexylmethyl-3',4'-epoxycyclohexane carboxylate and the tack-free time of the resulting photocurable composition in seconds was determined with various aromatic polynuclear hydrocarbons as sensitizers compared to various aromatic ketones as sensitizers. The following procedure was employed:

A stock solution was prepared from 3 grams of phenacyltetramethylenesulfonium hexafluoroarsenate dissolved in 10 ml of acetone and 100 grams of 3,4-epoxycyclohexylmethyl-3',4'-epoxycyclohexane carboxylate. There was added 20 milligrams of various photosensitizers to 5 gram aliquots of the aforementioned stock solution. The solutions were then spread as 3 mil films onto glass plates and irradiated with a GE H3T7 medium pressure mercury arc lamp equipped with a Pyrex filter to eliminate radiation below 300 nm. The distance from a sample to the lamp was 6 inches. The following tack-free times were obtained:

TABLE III

| Photosensitizer | Tack-free Time (sec) |
| --- | --- |
| blank | 115 |
| perylene | 15 |
| anthracene | 35 |
| pyrene | 15 |
| 1,2-benzanthracene | 40 |
| coronene | 45 |
| thioxanthone | 60 |
| phenothiazine | 45 |
| 2-chlorothioxanthone | 120 |
| 4-hydroxybenzophenone | 135 |
| benzophenone | 115 |
| 2,5-diphenylfuran | 30 |

The above results show that polynuclear aromatic hydrocarbons are effective as sensitizers for phenacyltetramethylenesulfonium hexafluoroarsenate.

EXAMPLE 3

In accordance with the procedure of Example 2, dimethyl(3,5-dimethyl-4-hydroxyphenyl)sulfonium hexafluoroarsenate was sensitized with various polynuclear aromatic hydrocarbons and aromatic ketones to determine the effectiveness of these sensitizers.

A stock solution was prepared consisting of 100 grams of the epoxy monomer of Example 2, 3 grams of dimethyl(3,5-dimethyl-4-hydroxyphenyl)sulfonium hexafluoroarsenate and 10 ml of acetone. There were added 20 milligrams of various sensitizers to 5 gram aliquots of the stock solution and the resulting mixtures were then evaluated in accordance with the procedure of Example 2 to determine tack-free times in minutes. The following results were obtained:

TABLE IV

| Photosensitizer | Tack-free Time (min) |
| --- | --- |
| blank | >12 |
| perylene | >12 |
| thioxanthone | 2 |
| 9-fluorenone | 2.5 |
| 2-chlorothioxanthone | 2.5 |
| benzophenone | 7 |

TABLE IV-continued

| Photosensitizer | Tack-free Time (min) |
| --- | --- |
| anthracene | 7 |
| 1,2-benzanthracene | 8 |
| 2,5-diphenylfuran | >11 |
| benz[a]anthracene-7,12-dione | 1.5 |

The above results show that aromatic ketones and quinones are effective sensitizers for dialkyl 4-hydroxyphenylsulfonium salts while polynuclear aromatic hydrocarbons are either inactive or marginally active.

EXAMPLE 4

A stock solution was prepared from 25 grams of limonene dioxide and 0.5 grams of dimethyl(3,5-dimethyl-4-hydroxyphenyl)sulfonium hexafluoroantimonate dissolved in 1 gram of acetone. Tack-free times in minutes were then determined in accordance with the procedure described in Example 2. The following results are obtained

TABLE V

| Photosensitizer | Tack-free Time (min) |
| --- | --- |
| blank | >8 |
| benz[a]anthracene-7,12-dione | 1.25 |
| 1,2-benzanthracene | >5 |
| 9-fluorenone | 3.5 |
| perylene | >5 |
| anthracene-9,10-dione | 2.5 |

The above results show that aromatic ketone are more effective as sensitizers for dimethyl(3,5-dimethyl-4-hydroxyphenyl)sulfonium hexafluoroantimonate than polynuclear aromatic hydrocarbons when utilized to effect the cure of limonene dioxide.

EXAMPLE 5

A photocurable mixture was prepared from 50 grams of tetrahydrofuran, 2.5 grams of polyvinylbutyral, 0.5 gram of 3,4-epoxycyclohexylmethyl-3',4'-epoxycyclohexane carboxylate and 0.2 gram phenacylpentamethylenesulfonium hexafluoroarsenate. There was added to 5 grams of the aforementioned photocurable mixture 5 milligrams of perylene. Glass plates were treated with the aforementioned sensitized photocurable mixture and a photocurable mixture free of perylene. The treated glass plates were allowed to dry and the resulting films were exposed to a GE H3T7 medium pressure mercury arc lamp equipped with a 300 nm glass filter for 4 minutes through a contact mask. The exposed films were sprayed with methanol to remove uncrosslinked portions of the image. The perylene sensitized film showed a clear definition of the image, while no image could be detected in the unsensitized blank.

Although the above examples are directed to only a few of the very many variables involved in the practice of the present invention, it should be understood that the present invention is directed to a much broader variety of photocurable compositions and sensitizers used in such compositions as shown in the description preceding these examples.

What we claim as new and desire to secure by Letters Patent of the United States is:

1. Compositions which are photocurable at wave lengths greater than 300 nm comprising a cationically polymerizable organic material and an effective amount of a photoinitiator having the formula

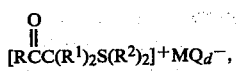

sensitized with an effective amount of a sensitizer selected from perylene, anthracene, mixture thereof, phenothiazene, where R is a member selected from $C_{(6-13)}$ monovalent aromatic organic radicals and substituted $C_{(6-13)}$ monovalent aromatic organic radicals, $R^1$ is a monovalent radical selected from hydrogen, $C_{(1-8)}$ alkyl and mixtures thereof, $R^2$ is a $C_{(1-13)}$ monovalent organic radical, or a divalent organic radical which can form a cyclic structure selected from the group consisting of

M is a metal or metalloid, Q is halogen and d is equal to 4-6.

2. A photocurable composition in accordance with claim 1, where the arylonium salt is phenacyltetramethylenesulfonium hexafluoroarsenate.

3. A photocurable composition in accordance with claim 1, where the cationically polymerizable organic material is an epoxy resin or mixture of epoxy resins.

4. A photocurable composition in accordance with claim 1, where the polynuclear aromatic compound is perylene.

5. A photocurable composition is accordance with claim 1, where the cationically polymerizable organic material is a difunctional vinyl ether.

6. A photocurable composition in accordance with claim 1, where the polynucler aromatic compound is anthracene.

7. A photocurable composition in accordance with claim 1, where the photosensitizer is phenothiazine.

* * * * *